(12) United States Patent
Farnworth

(10) Patent No.: US 8,129,839 B2
(45) Date of Patent: Mar. 6, 2012

(54) ELECTRONIC DEVICE PACKAGE STRUCTURES

(75) Inventor: Warren M. Farnworth, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 1219 days.

(21) Appl. No.: 11/184,166

(22) Filed: Jul. 19, 2005

(65) Prior Publication Data

US 2005/0253261 A1 Nov. 17, 2005

Related U.S. Application Data

(62) Division of application No. 10/370,755, filed on Feb. 20, 2003, now Pat. No. 7,043,830.

(51) Int. Cl.
*H01L 23/48* (2006.01)
(52) U.S. Cl. ........ 257/734; 257/738; 257/737; 257/678; 257/E21.508; 257/E23.021
(58) Field of Classification Search .................. 257/738, 257/734, 737, 678, E21.508, E23.021
See application file for complete search history.

(56) References Cited

U.S. PATENT DOCUMENTS

| | | | |
|---|---|---|---|
| 4,653,175 A | 3/1987 | Brueggeman et al. | |
| 5,045,918 A | 9/1991 | Cagan et al. | |
| 5,185,210 A | 2/1993 | Zupancic | |
| 5,196,371 A | 3/1993 | Kulesza et al. | |
| 5,244,833 A | 9/1993 | Gansauge et al. | |
| 5,762,259 A | 6/1998 | Hubacher et al. | |
| 5,987,739 A | 11/1999 | Lake | |
| 6,020,561 A * | 2/2000 | Ishida et al. | 174/261 |
| 6,180,504 B1 | 1/2001 | Farnworth et al. | |
| 6,251,488 B1 | 6/2001 | Miller et al. | |
| 6,259,962 B1 | 7/2001 | Gothait | |
| 6,268,584 B1 | 7/2001 | Keicher et al. | |
| 6,326,698 B1 | 12/2001 | Akram | |
| 6,337,122 B1 | 1/2002 | Grigg et al. | |
| 6,358,834 B1 | 3/2002 | Shieh et al. | |
| 6,387,795 B1 | 5/2002 | Shao | |
| 6,391,251 B1 | 5/2002 | Keicher et al. | |
| 6,432,752 B1 | 8/2002 | Farnworth | |
| 6,443,059 B1 | 9/2002 | Lee | |
| 6,451,681 B1 * | 9/2002 | Greer | 438/601 |
| 6,482,576 B1 | 11/2002 | Farnworth et al. | |
| 6,489,007 B2 | 12/2002 | Grigg et al. | |
| 6,504,241 B1 | 1/2003 | Yanagida | |
| 6,514,798 B2 | 2/2003 | Farnworth | |
| 6,524,346 B1 | 2/2003 | Farnworth | |
| 6,544,821 B2 | 4/2003 | Akram | |

(Continued)

OTHER PUBLICATIONS

Miller et al., "Maskless Mesoscale Materials Deposition", Deposition Technology, Sep. 2001, pp. 20-22.

(Continued)

*Primary Examiner* — Junghwa M Im
(74) *Attorney, Agent, or Firm* — TraskBritt

(57) ABSTRACT

A sealing layer is provided on a surface of a substrate, such as a semiconductor wafer. The sealing layer includes apertures which expose external contact locations for semiconductor dice formed on the wafer. Solder paste is deposited in the apertures and reflowed to form discrete conductive elements for attachment of electronic devices to higher level circuit structures. The wafer is then divided or "singulated" to provide individual semiconductor dice having their active surfaces covered by the sealing layer. In this manner, the sealing layer initially acts as a stencil for forming the discrete conductive elements and subsequently forms a chip scale package structure to protect the semiconductor dice from the environment.

25 Claims, 6 Drawing Sheets

U.S. PATENT DOCUMENTS

| | | |
|---|---|---|
| 6,544,902 B1 | 4/2003 | Farnworth |
| 6,549,821 B1 | 4/2003 | Farnworth et al. |
| 6,562,278 B1 | 5/2003 | Farnworth et al. |
| 6,585,927 B2 | 7/2003 | Grigg et al. |
| 6,593,171 B2 | 7/2003 | Farnworth |
| 6,593,220 B1 | 7/2003 | Yu et al. |
| 6,635,333 B2 | 10/2003 | Grigg et al. |
| 6,703,105 B2 | 3/2004 | Grigg et al. |
| 6,706,374 B2 | 3/2004 | Grigg et al. |
| 6,709,795 B2 | 3/2004 | Farnworth et al. |
| 6,740,476 B2 | 5/2004 | Farnworth et al. |
| 6,762,502 B1 | 7/2004 | Akram |
| 6,770,514 B2 | 8/2004 | Farnworth |
| 6,787,923 B2 | 9/2004 | Tan et al. |
| 6,791,164 B2 | 9/2004 | Farnworth |
| 6,794,224 B2 | 9/2004 | Akram |
| 6,861,763 B2 | 3/2005 | Akram |
| 6,875,640 B1 | 4/2005 | Farnworth et al. |
| 6,890,801 B2 | 5/2005 | Farnworth |
| 6,893,804 B2 | 5/2005 | Farnworth et al. |
| 6,893,904 B2 | 5/2005 | Akram |
| 6,909,929 B2 | 6/2005 | Farnworth et al. |
| 6,911,173 B2 | 6/2005 | Farnworth |
| 6,949,834 B2 | 9/2005 | Connell et al. |
| 2002/0171177 A1 | 11/2002 | Kritchman et al. |
| 2002/0182782 A1 | 12/2002 | Farnworth |
| 2003/0003180 A1 | 1/2003 | Farnworth et al. |
| 2003/0043360 A1 | 3/2003 | Farnworth |
| 2003/0102566 A1 | 6/2003 | Farnworth |
| 2003/0151167 A1 | 8/2003 | Kritchman et al. |
| 2003/0201531 A1 | 10/2003 | Farnworth et al. |
| 2003/0203158 A1 | 10/2003 | Farnworth et al. |
| 2004/0000744 A1 | 1/2004 | Grigg et al. |
| 2004/0005770 A1 | 1/2004 | Farnworth et al. |
| 2004/0014255 A1 | 1/2004 | Grigg et al. |
| 2004/0063322 A1 * | 4/2004 | Yang ............................ 438/689 |
| 2004/0077109 A1 | 4/2004 | Tan et al. |
| 2004/0080027 A1 | 4/2004 | Grigg et al. |
| 2004/0141298 A1 * | 7/2004 | Harvey ........................ 361/764 |
| 2004/0142058 A1 | 7/2004 | Farnworth |
| 2005/0082651 A1 | 4/2005 | Farnworth et al. |

OTHER PUBLICATIONS

Miller, "New Laser-Directed Deposition Technology", Microelectronic Fabrication, Aug. 2001, p. 16.

Webpage, Objet Prototyping the Future, Objet FullCure700 Series, (2003) 2 pages.

Webpage, Objet Prototyping the Future, How it Works, (2003) 2 pages.

* cited by examiner

ELECTRONIC DEVICE PACKAGE STRUCTURES

CROSS-REFERENCE TO RELATED APPLICATION

This application is a divisional of application Ser. No. 10/370,755, filed Feb. 20, 2003, now U.S. Pat. No. 7,043,830, issued May 16, 2006.

BACKGROUND OF THE INVENTION

1. Field of the Invention

The present invention relates to packaging of electronic devices. More particularly, the present invention relates to a sealing layer that protects the surface of a semiconductor die and is also used to form conductive bumps on the die bond pads.

2. State of the Art

Factors of cost and density are increasingly important in the electronics industry. Conventionally, high density electronic devices in the form of semiconductor dice are packaged in housings for protection from the environment and to provide electrical connections with the higher level circuit structures into which they are incorporated. In an effort to reduce size and expense, semiconductor manufacturers have developed chip scale package (CSP) structures which add minimal dimension to the completed devices and eliminate processing steps associated with prior packaging methods. These CSP structures often involve forming protective polymer layers or other material films adhered directly on a surface of a semiconductor die to seal it from the environment. According to this process, a passivation layer is typically formed on the active surface of the die with apertures to expose the die bond pads, and an under-bump metallization (UBM) layer is formed over the exposed bond pads. The UBM layer provides improved bonding properties and, if necessary, extends across the passivation layer in the form of a redistribution layer to relocate the external contact locations for connecting the die to higher level circuit structures. Discrete conductive elements in the shape of bumps or balls are then formed on or attached to the external contact locations to enable connection with higher level circuit structures by flip-chip or tape automated bonding (TAB) attachment. A mask layer may optionally be applied to surround the external contact locations prior to forming the conductive bumps, which prevents the bump material from wicking onto adjacent die surfaces. Finally, a layer of polymer or similar sealing material may be coated onto one or more surfaces of the die to complete the CSP. The completed package is essentially no larger than the die itself.

A further advantage of CSP structures is that they may be fashioned wholly or in part prior to the singulation of a wafer containing a plurality of semiconductor die locations. This approach, often being referred to as "wafer-level packaging," thereby provides simultaneous formation of a large number of electronic device packages. After the desired circuitry, bond pads, a passivation layer, UBM and optional mask layers for the electronic devices have been fabricated on the active surface of the wafer, conductive bumps are provided using conventional formation methods. One widely used method is by evaporative deposition of metal onto a mask. The mask is formed on the wafer with apertures corresponding to the bond pad locations and consecutive layers of metal are deposited in the apertures. Once enough metal is deposited, the mask is removed and the metal is reflowed by heating to a molten state to form a final bump or ball shape. Another alternative is to employ stencil printing. Rather than evaporating metal through a mask, a solder paste is screened over a stencil and fills apertures therein corresponding to the bond pad locations. The stencil is removed from the surface of the wafer, and the solder is reflowed for bonding to the UBM. Once the conductive bumps are in place, the entire active surface of the wafer is coated with the aforementioned CSP sealing layer. This is accomplished by molding, spin-coating or otherwise applying the sealing layer to the surface of the wafer by methods known in the art. The wafer is subsequently singulated to excise the individual semiconductor dice, and further sealing layers may be added to coat any remaining exposed die surfaces.

A disadvantage to wafer-level packaging has been that the above-described methods for forming conductive bumps are often cumbersome and unreliable. The evaporative deposition method, for instance, requires a great deal of time to apply the metal and further involves a large capital investment for deposition equipment. Likewise, in the stencil printing method, portions of the solder paste may be retained in the stencil apertures during removal, thereby producing nonuniform bump volumes which create problems with die connection to higher level circuit structures. Stencils used for bump formation also typically require aperture depths of only a few thousandths of an inch and are, therefore, constructed of thin sheets of material which may be easily damaged during handling. Another drawback that has heretofore been encountered with wafer-level packaging involves forming the conductive bumps before applying the sealing layer to the wafer active surface. The sealing layer often completely covers the conductive bumps and must, therefore, be etched back, ground down or otherwise partially removed to expose the conductive bumps for electrical contact. Furthermore, surface tension between the sealing layer material and the conductive bumps can cause irregularities during coating and thereby reduce the uniformity of the sealing layer.

Prior to singulation of the semiconductor dice from the wafer, it may also be necessary to reduce the thickness of a wafer by back grinding. This is desirable to minimize the amount of time required to saw through a thick wafer during singulation and further reduces the final package size. Because back grinding is typically carried out after formation of the conductive bumps, it is necessary to cover them with a protective adhesive tape during the grinding operation. Further processing must then be carried out to remove the tape and clean the conductive bumps of any residual adhesive material.

Plainly, what is needed are CSP structures and wafer-level packaging methods that eliminate existing problems associated with forming and further processing conductive bumps on the active surface of semiconductor dice.

BRIEF SUMMARY OF THE INVENTION

In contrast to the above-described state of the art, the present invention enables conductive bumps to be formed on a semiconductor die after the die has been wholly or partially encased by CSP sealing layers. Specifically, the present invention provides a wafer-level packaging method wherein a sealing layer is applied to the active surface of a wafer, or other bulk semiconductor substrate, with apertures to expose the external contact locations of the semiconductor dice contained in the wafer. The sealing layer is subsequently used to form conductive bumps on the bond locations. In a manner similar to that used for forming bumps by stencil printing, solder paste is screened over the sealing layer and fills the apertures therein to cover the die external contact locations.

The solder is reflowed, and surface tension pulls the solder into a bump or ball-like shape which can be used for connection to higher level circuit structures. By using the sealing layer as an in situ stencil, the conductive bumps may be formed without the complexity of evaporative deposition processes while eliminating the concern of retaining volumes of solder in a conventional separate stencil. Moreover, because the conductive bumps are formed after the active surface of the wafer has been sealed, additional processing to expose the bumps is not required and the conductive bumps will not create irregularities in the sealing layer. This also eliminates the need for covering the conductive bumps with tape during back grinding, as the conductive bumps may be applied after that process is complete.

In one embodiment of the present invention, after forming the bond pads, passivation layer and UBM on the active surface of a wafer, a mask layer is applied by conventional methods to surround the UBM at defined external contact locations and seal off adjacent surfaces on the wafer. A sealing layer comprised of a polymer or other material with suitable sealing properties is then formed over the mask layer to cover the active surface of the wafer. The sealing layer is fashioned with apertures at the external contact locations which are dimensioned to contain enough solder paste to form a conductive bump of a specified volume. Once the sealing layer is in place, if necessary, the wafer is thinned using a back grinding process. After back grinding, solder paste is screened directly over the surface of the sealing layer to fill the apertures, and the solder paste is reflowed to form conductive bumps. The wafer is then singulated to provide individual semiconductor dice, with the sealing layer acting as a CSP structure to protect the active surfaces of the dice. Additional sealing layers may also be applied to other die surfaces, before or after singulation, to create CSP structures that provide a more completely encapsulated die.

In a further embodiment of the present invention, the sealing layer is formed on the active surface of the wafer using stereolithography (STL). STL, as conventionally practiced, involves utilizing a computer to generate a three-dimensional model of an object to be fabricated, such generation usually being effected with computer-aided design (CAD) software. The model is comprised of a large number of relatively thin, superimposed layers, a completed stack of which defines the entire object. The model is then employed to generate an actual object by building the object, layer by superimposed layer. A wide variety of approaches have been developed for this STL object formation. One common approach involves the formation of solid structures by selectively curing volumes of a liquid polymer or resin material contained within a tank or reservoir. Depending on the liquid material composition, curing may be accomplished by exposure to irradiation of selected wavelengths of light or other electromagnetic radiation, for instance, when curing a material susceptible to initiation of cross-linking by exposure to ultraviolet (UV) radiation. In this manner, the sealing layer of the present invention may be provided by submerging a wafer below the surface of a curable liquid polymer or other curable liquid sealing material to a desired depth one or more times and selectively curing one or more layers of the liquid residing over the wafer onto the mask layer to cover the active surface of the wafer. Areas around the external contact locations on the wafer are left uncured and the liquid removed therefrom to form the apertures in the sealing layer for retaining solder paste.

As an alternative to the above embodiment, STL may also be used to create the mask layer that covers the active surface of the wafer and surrounds the external contact locations. By using STL rather than conventional masking methods, the mask layer and the sealing layer may be formed in a single operation. The curable liquid is first cured in one or more layers to form the mask pattern covering the active surface of the wafer and defining the external contact locations. Successive layers are then cured in the desired pattern for the sealing layer. The wafer-level packaging may then be completed without requiring additional, separate processes to form the mask layer and sealing layer.

Other and further features and advantages will be apparent from the following detailed description of the present invention when read in conjunction with the accompanying drawings. It should be understood that the embodiments described are provided for illustrative and exemplary purposes only and that variations to, and combinations of, the several elements and features thereof are contemplated as being within the scope of the invention.

BRIEF DESCRIPTION OF THE SEVERAL VIEWS OF THE DRAWINGS

In the drawings, which illustrate what is currently considered to be the best mode for carrying out the invention.

DETAILED DESCRIPTION OF THE INVENTION

Figure 1A:
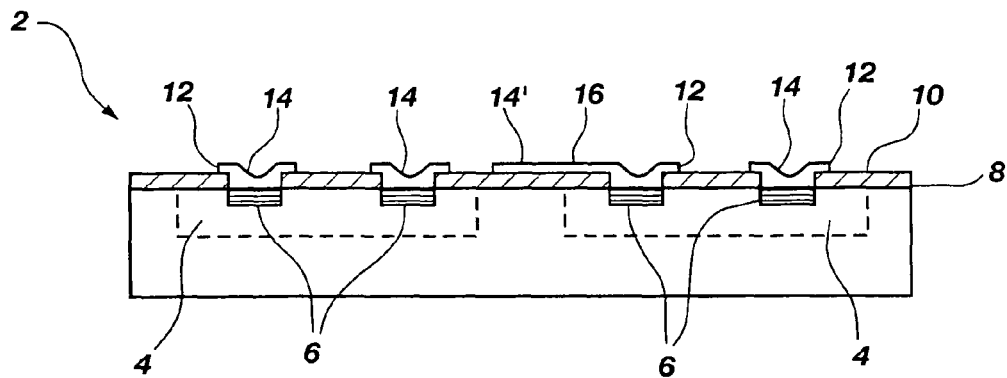
FIGS. 1A and 1B show a sectional side view of a semiconductor wafer at a stage of fabrication prior to forming a sealing layer according to the present invention.

Referring in general to the accompanying drawings, various aspects of the present invention are illustrated to show the CSP structures and conductive bump formation methods of the present invention. Common elements of the illustrated embodiments are designated with like reference numerals. It should be understood that the figures presented in the drawings are not illustrative of actual views of any particular portion of actual device structures, but are merely idealized schematic representations which are employed to more clearly and fully depict the invention.

In FIG. 1A, a semiconductor wafer 2 is shown at a stage of fabrication prior to carrying out any wafer-level packaging. As used herein, the term "wafer" includes not only conventional silicon wafers but also other bulk substrate materials such as wafers of gallium arsenide, indium phosphide, silicon on sapphire (SOS) substrates, silicon on glass (SOG) substrates and other silicon on insulator (SOI) substrates. Wafer 2 contains a plurality of semiconductor die locations 4 including integrated circuitry formed by conventional semiconductor processing techniques. Bond pads 6 located on wafer active surface 8 provide electrical connection points for the integrated circuitry of semiconductor die locations 4. Wafer 2 is further provided with a passivation layer 10 to cover active surface 8 while exposing bond pads 6, and UBM 12 is formed over the exposed bond pads. The UBM 12 is typically formed of one or more layers of metal which protect bond pads 6 and provide improved external contact locations 14 for subsequently added discrete conductive elements. As shown in FIG. 1A, UBM 12 may also be extended across passivation layer 10 in the form of a redistribution layer (RDL) 16 to provide alternate external contact locations 14' for discrete conductive elements. The manner in which passivation layer 10 and UBM 12 are configured on active surface 8 is well known in the art and need not be further discussed in relation to the features of the present invention.

Figure 1B:
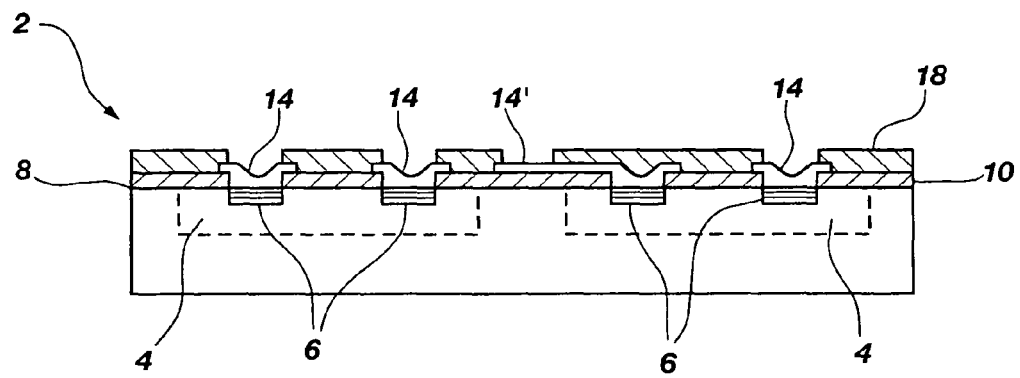

Once wafer 2 has been fabricated as in FIG. 1A, it is often desirable to surround external contact locations 14, 14' with a dielectric barrier to assist in the subsequent formation of conductive elements thereon. FIG. 1B shows wafer 2 with a mask layer 18 that has been applied for this purpose. Mask layer 18 is formed, by way of example, with a spun-on dielectric that covers active surface 8 of wafer 2 with a film of polymer material having a thickness of about 3 to 14 microns. The film is then etched to provide openings which define the size and shape of external contact locations 14, 14' and prevent conductive element materials from spreading or wicking onto adjacent surfaces during later processing.

Conventionally, the next step in fabrication for wafer 2 would typically be to form discrete conductive elements in the shape of bumps or balls on external contact locations 14, 14' using the above-described evaporative deposition or stencil printing methods. As discussed, such methods suffer from a number of problems which may result in defects and reduce efficiency. In the present invention, prior to adding conductive elements, a dielectric sealing layer 20 (FIGS. 2A-2D) is formed on active surface 8 of wafer 2. Sealing layer 20 acts as part of a CSP structure for a completed device and is also used as a stencil for forming conductive elements. FIGS. 2A-2D illustrate how these functions are accomplished.

Figure 2A:
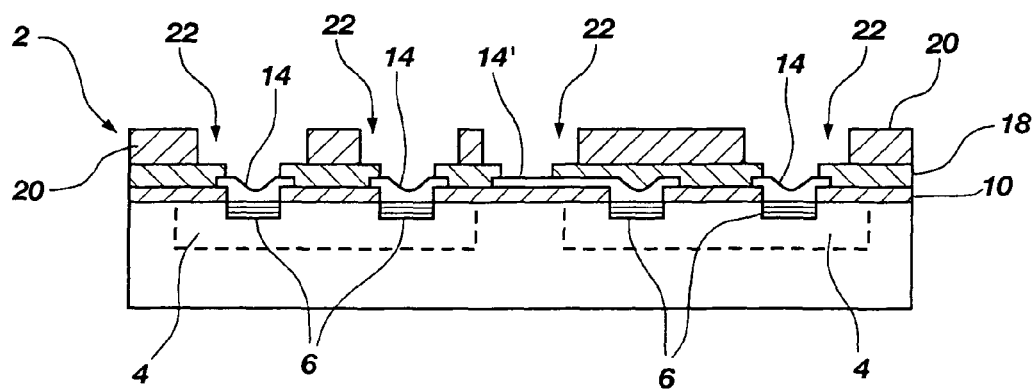
FIGS. 2A-2E show the formation of conductive bumps according to the present invention on the semiconductor wafer depicted in FIGS. 1A and 1B.

As shown in FIG. 2A, wafer 2 has been furnished with sealing layer 20 by methods which will be discussed in further detail below. In the present embodiment, sealing layer 20 is formed over mask layer 18 to cover substantially all of active surface 8, except for apertures 22, which expose external contact locations 14, 14' and act to retain solder paste for bump formation. As with the apertures in a stencil, apertures 22 are dimensioned such that they will contain an amount of solder paste sufficient to form a conductive bump of a volume and height that extends above sealing layer 20, allowing for subsequent flip-chip or TAB connection. Apertures 22 must accordingly be larger than their associated external contact locations 14, 14', and a portion of mask layer 18 will therefore be exposed through apertures 22.

Figure 3:
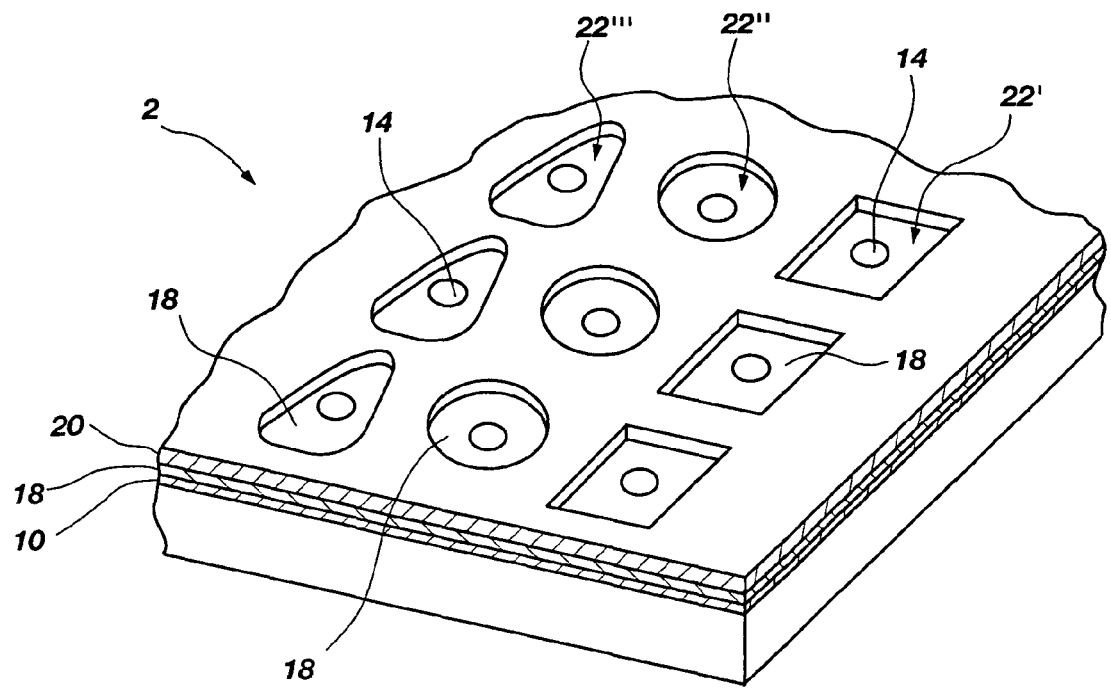
FIG. 3 is a partial perspective view showing apertures formed in a sealing layer applied to the semiconductor wafer of FIGS. 1A and 1B.

Apertures 22 may be square or rectangular, or may be fashioned into more complex shapes which are known to assist in the uniform application of solder paste during stencil printing. FIG. 3 shows a partial perspective view of sealing layer 20 which more clearly illustrates exemplary aperture shapes. Apertures 22' present a conventional square or rectangular shape, apertures 22'' are circular and apertures 22''' are configured to have a tear-drop or elliptical shape. As seen in FIG. 3, apertures 22', 22'' and 22''' leave a portion of mask layer 18 exposed around external contact locations 14 such that they provide an adequate volume to contain enough solder paste for bump formation. The specific size and shape of apertures 22 will depend on factors such as the density (pitch) of the external contact locations 14 and the formulation of solder paste used for bump formation. Therefore, use of any possible aperture shape is contemplated as being within the scope of the present invention.

Figure 2B:
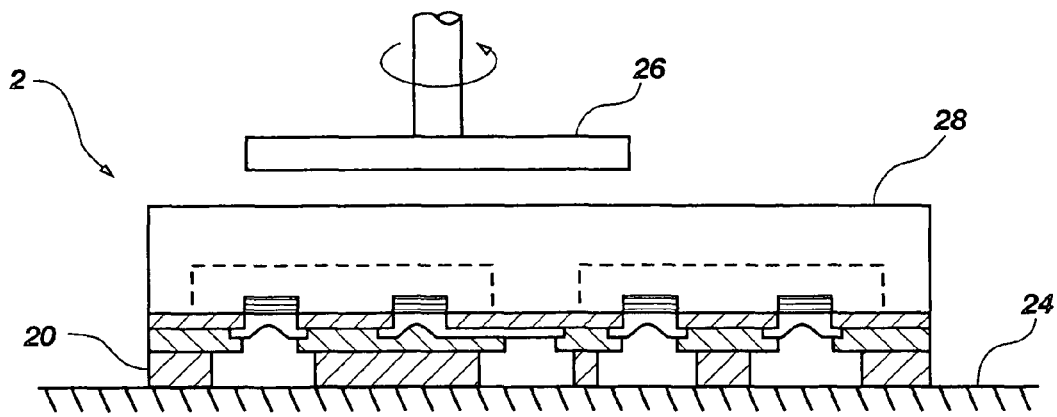

Turning back to FIG. 2B, in some instances it may be necessary or desirable to reduce the thickness of wafer 2 by back grinding. According to the present invention, this process may be completed prior to bump formation. As shown in FIG. 2B, wafer 2 is secured in an inverted position on a support surface 24, which may comprise a so-called "wafer chuck". Wafer 2 may be secured in place, by way of example, with a vacuum drawn through support surface 24 or by conventional mechanical clamping mechanisms. Because wafer 2 has not yet been supplied with conductive elements on external contact locations 14, 14', sealing layer 20 rests directly against support surface 24 and the conventional, previously noted layer of protective tape is not required. Grinding wheel 26 is applied to the back surface 28 of wafer 2 to abrasively remove a desired amount of material therefrom. Once wafer 2 has been appropriately thinned, it is ready for bump formation.

Figure 2C:
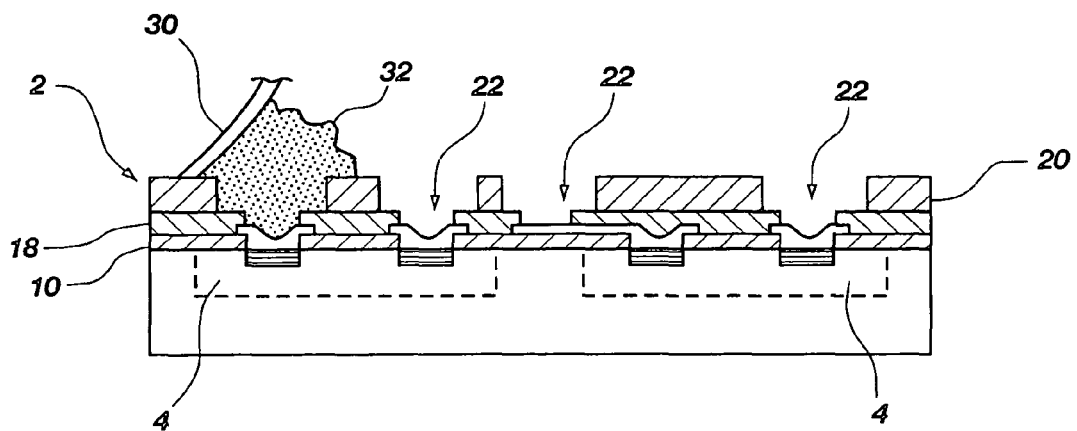
Figure 2D:
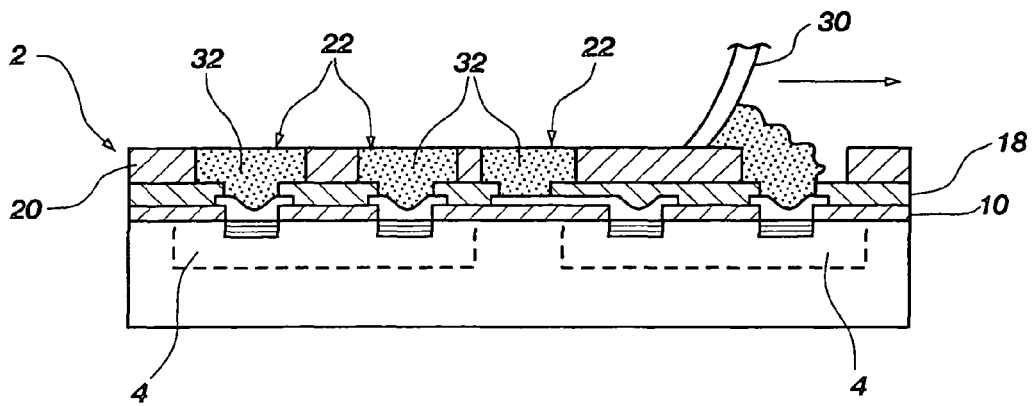

In FIG. 2C, a wiper blade 30 is shown positioned over wafer 2 and a mass of solder paste 32 is being applied over sealing layer 20 proximate to one side of wafer 2. As is known in the art, solder paste 32 comprises fine particles of metals or alloys, such as a conventional tin/lead alloy, which are suspended in a flux material. In FIG. 2D, wiper blade 30 screens solder paste 32 across the surface of sealing layer 20 to fill apertures 22 in a manner similar to stencil printing. Indeed, it is possible that conventional stencil printing equipment might be used to carry out this operation. The equipment would simply be configured and positioned to pass wiper blade 30 directly across the surface of sealing layer 20 without a conventional stencil. By directly applying solder paste 32 to apertures 22 in sealing layer 20, the aforementioned problems with solder retention on the wafer 2 due to stencil removal are absent. Using sealing layer 20 as the printing instrument has the added benefit of eliminating the time and cost associated with fabricating and handling conventional stencils.

Figure 2E:
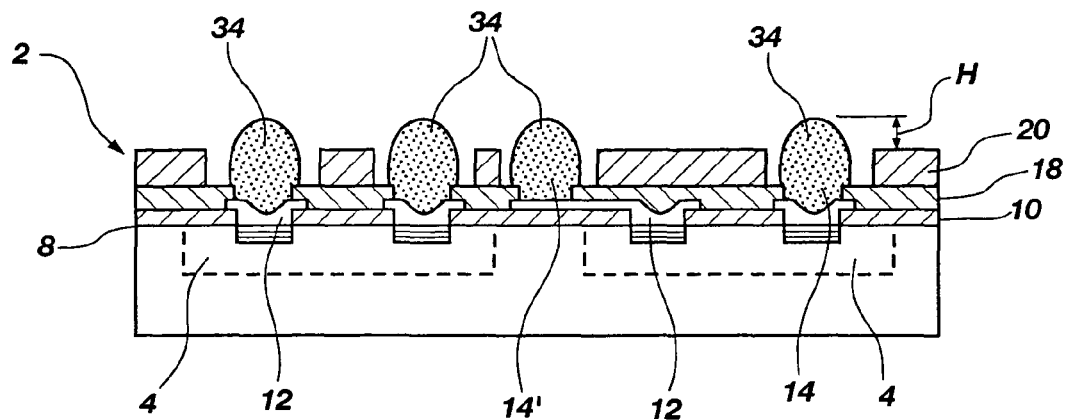

Upon completion of the printing process, solder paste 32 is reflowed with a conventional heating process, such as in an oven or using heat lamps, to form conductive bumps 34, as shown in FIG. 2E. When heated, the metals in solder paste 32 liquefy, volatiles in the flux are driven off and the molten alloy is formed into a sphere over external contact locations 14, 14', and, by surface tension attraction to UBM 12, thereby pulls away from the sides of apertures 22 and the underlying exposed portions of mask layer 18. The liquid alloy thus merges into a bump or ball-like shape over external contact locations 14, 14' extending a height H above sealing layer 20. The alloy wets and bonds to the underlying UBM 12 upon cooling and solidification, thereby providing semiconductor die locations 4 with conductive bumps 34 which are suitable for attachment to higher level circuit structures. Because sealing layer 20 is already in place on active surface 8, there is no need to add further CSP structure materials over conductive bumps 34. Accordingly, no sealing irregularities are introduced by conductive bumps 34, and additional processing to expose conductive bumps 34 is not required.

After forming conductive bumps 34, and depending on the formulation of solder paste 32, it may be necessary to clean the surface of wafer 2 of residual flux material. Flux compounds are intended to chemically attack surface oxides such that molten solder can better wet and adhere to the UBM at the external contact locations. Some fluxes are sufficiently caustic that, over time, they will damage component surfaces. Such residual flux material must, therefore, be removed by a cleaning process after solder reflow. If cleaning is not desirable or practical, so-called "no-clean" solder pastes may sometimes be used. These paste formulations contain special epoxy or resin-based fluxes that are less caustic and may be left on a component surface that is not overly sensitive to corrosion. A no-clean solder paste is, therefore, desirable for use with the present invention in order to avoid additional processing of wafer 2. "No-clean" solder pastes are commercially available from vendors such as the Kester Corporation of Des Plaines, Ill., under the brand name OMNIX® 5000.

Figure 4:
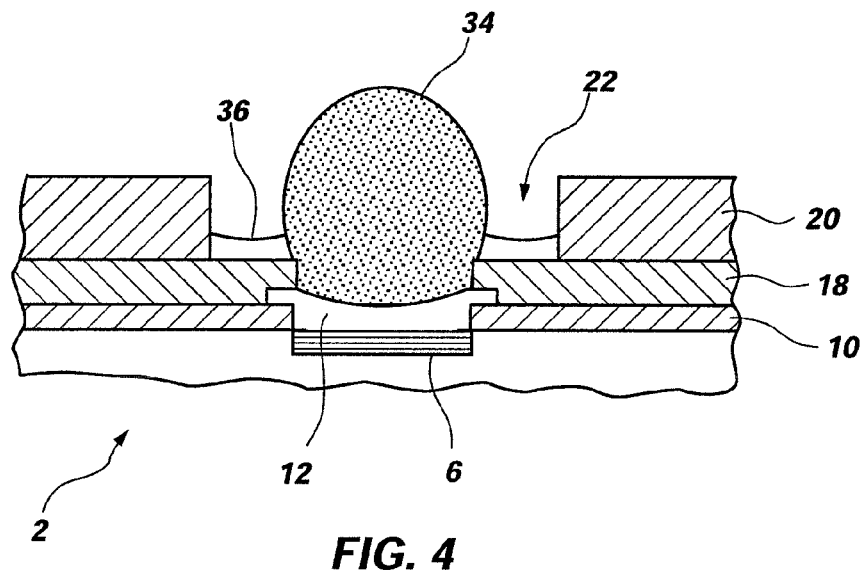
FIG. 4 shows an enlarged view of a conductive bump formed on a semiconductor wafer wherein residual flux material from solder paste forms a support layer for the conductive bump.

Leaving the flux material in place on wafer 2 has the added benefit that it may act to absorb forces applied to conductive bumps 34. A method for strengthening conductive elements by way of a polymer support member formed to encompass the base portions of the conductive elements is discussed in U.S. Pat. No. 6,180,504, issued Jan. 30, 2001, to Farnworth et al., the disclosure of which patent is incorporated herein in its entirety. In an embodiment disclosed by the patent, the support member comprises a cured polymer layer deposited on the surface of a semiconductor substrate. In the present invention, it is contemplated that the residual epoxy or resin flux material from a no-clean solder paste may similarly act to strengthen conductive bumps 34. When the no-clean solder paste is reflowed, the flux material sets into a hardened polymer layer that provides a supporting function. FIG. 4 shows an enlarged view of a conductive bump 34 formed on wafer 2 wherein residual flux material forms a lateral support layer 36 for conductive bump 34. Because solder paste 32 has been deposited within apertures 22 of sealing layer 20, the support layer 36 will be centralized around conductive bump 34 and encompass its base.

Figure 5A:
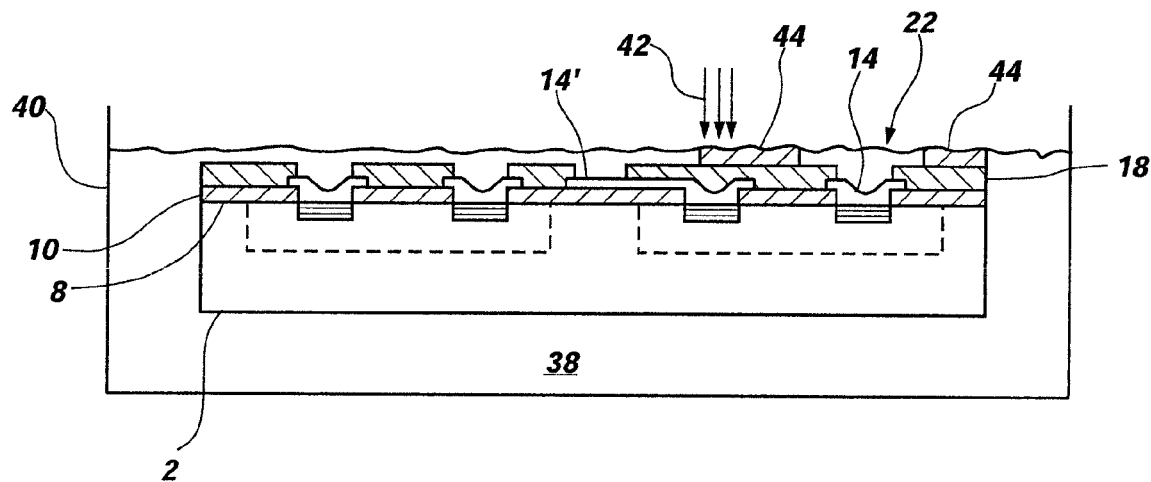
FIGS. 5A and 5B show the formation of a sealing layer on a semiconductor wafer using STL.
Figure 5B:
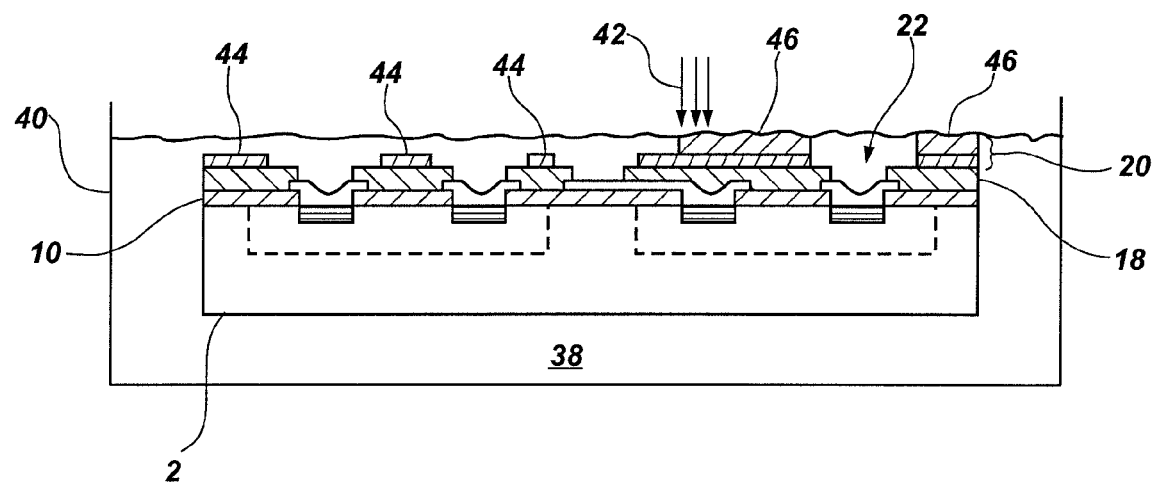

A further feature of the present invention provides for sealing layer 20 to be formed by an STL process. As previously discussed, STL entails superimposing layers of a selectively cured material to form three-dimensional solid structures. FIGS. 5A and 5B illustrate an example of how STL may be used to create sealing layer 20 on wafer 2.

In FIG. 5A, wafer 2 is placed at a selected depth below the surface of a polymer or resin photocuiable liquid 38 contained within a reservoir 40. The use of a photocurable liquid 38 is only exemplary, and materials cured by other activating agents could also be used. A focused beam of energy such as a laser beam 42 is directed over the surface of photocurable liquid 38 in a pattern that extends across active surface 8 of wafer 2. The portions of photocurable liquid 38 exposed to laser beam 42 cure to at least a semisolid state, forming a first layer of cured material 44 adhered to wafer 2. In the first embodiment of the invention, a sealing layer in the form of first layer 44 would be formed over mask layer 18. FIG. 5A shows the layer formation process at a point where first layer 44 has been formed across about half of the active surface 8 of wafer 2. Areas around external contact locations 14, 14' on wafer 2 are left uncured to form apertures 22 in first layer 44. FIG. 5B shows that wafer 2 may then be lowered to another selected depth within reservoir 40, and laser beam 42 directed over photocurable liquid 38 in the same pattern as before to form a second layer of cured material 46 on top of the first layer 44. Additional layers may be added until sealing layer 20 is formed to a height providing a desired volume for apertures 22. The final height or thickness of sealing layer 20 may be similar to that of a stencil used for bump formation, for example, about 4 mils (0.004") for a 14-mil conductive bump.

The adaptation of STL to the present invention is further simplified by the fact that STL processes are typically carried out under the control of a computer using a CAD-generated file of object configuration, dimensions and topography. Software also exists that is used to generate CAD files for designing and fabricating stencils. Accordingly, the same CAD-generated files for stencils may be used to control STL formation of sealing layer 20. Systems suitably configured for performing a computer-controlled STL process in this manner are commercially available from such vendors as 3D Systems, Inc., of Valencia, Calif. Suitable photopolymers for implementation of the present invention are also available from 3D Systems, Inc., under the product name DURAFORM®.

Figure 6A:
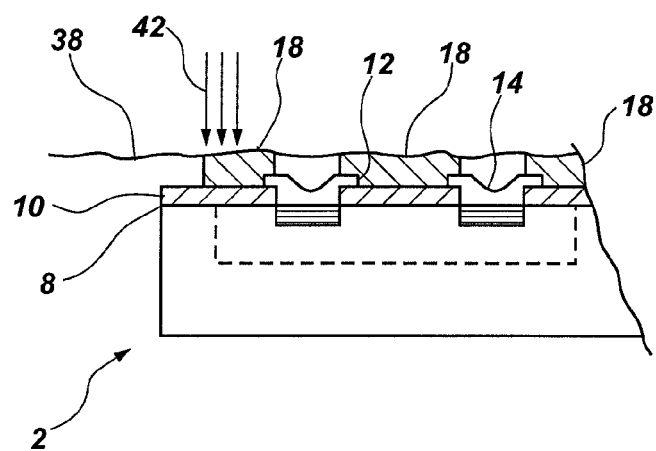
FIGS. 6A and 6B show an alternative embodiment of the present invention wherein a mask layer on a semiconductor wafer is formed concurrently with the sealing layer of the present invention.
Figure 6B:
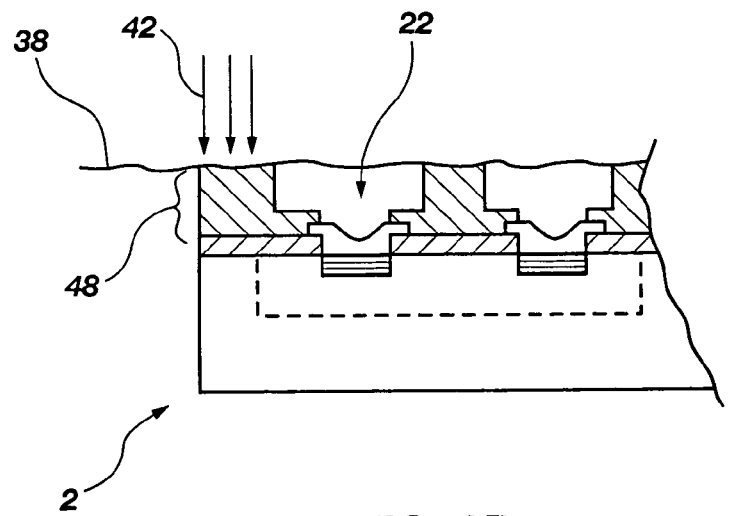

In another embodiment of the present invention, STL may also be used to create the mask layer 18, which provides a barrier around external contact locations 14, 14'. This allows mask layer 18 to be formed concurrently with sealing layer 20, thereby eliminating the need for additional processing using conventional masking techniques. FIGS. 6A and 6B are enlarged partial views of wafer 2 showing this alternative. Once wafer 2 has been completed to the point of having UBM 12 formed thereon, it is placed below the surface of photocurable liquid 38, which is cured in the same manner as previously discussed. As seen in FIG. 6A, laser beam 42 is first directed over active surface 8 in a pattern that covers all of passivation layer 10 and UBM 12 except for areas intended for external contact locations 14, 14' on UBM 12. Laser beam 42 follows this pattern until sufficient layers of cured polymer material have been added to achieve a thickness desired for mask layer 18. Laser beam 42 is then directed over active surface 8 in a pattern having the expanded or enlarged uncured areas to form stepped apertures 22 in sealing layer 20. FIG. 6B shows that mask layer 18 and sealing layer 20 form a homogenous unitary structure 48 formed by a single operation. Forming mask layer 18 and sealing layer 20 as a unitary structure 48 also reduces the possibility of delaminations which may occur when separately formed material layers are bonded together.

Of course, the formation of sealing layer 20 and mask layer 18 is not limited to the specific submersion-type STL process that is described above. Rather than submerging wafer 2 in a reservoir, for example, photocurable liquid 38 could be deposited on wafer 2 by spin coating and then cured in the pattern of one or both of sealing layer 20 and mask layer 18.

Figure 7:
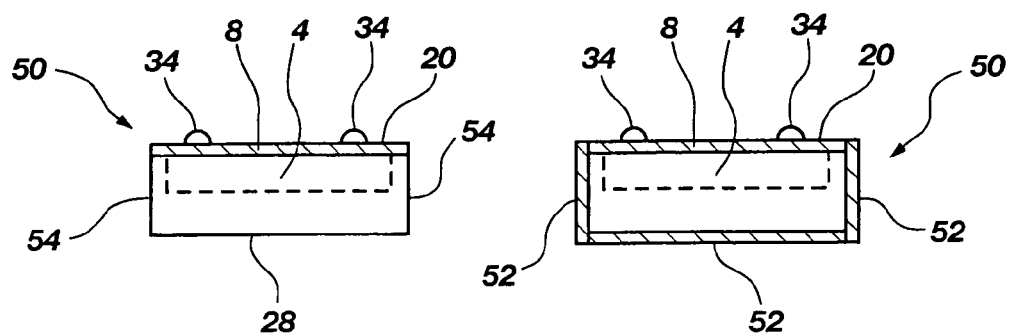
FIG. 7 shows singulated semiconductor dice having one or more sealing layers acting as CSP structures.

Under all of the above embodiments, once sealing layer 20 and conductive bumps 34 have been fabricated on wafer 2, it may be singulated along lines between semiconductor die locations 4 to provide individual semiconductor dice 50. Sealing layer 20 acts as a CSP structure to protect active surface 8 of a die 50, as shown in FIG. 7. Additional sealing layers 52 may be applied to back surface 28 and side surfaces 54 of a die 50 to form a more completely encapsulated CSP structure. Of course, one or more additional sealing layers 52 may be formed before singulation, such as by covering back surface 28 immediately after the back grinding operation. It is also possible for portions of die side surfaces 54 adjacent to active surface 8 to be sealed concurrently with the formation of sealing layer 20. This would be accomplished by cutting or etching trenches in wafer 2 around semiconductor die locations 4 prior to forming sealing layer 20. Materials used for sealing layer 20 would also fill the trenches to seal portions of die side surfaces 54.

Although the present invention has been described with respect to the illustrated embodiments, various additions, deletions and modifications are contemplated as being within its scope. For instance, while the disclosed embodiments show the external contact locations as being on the UBM layer of a semiconductor wafer, it is possible that the UBM might be omitted and that the bond pads would comprise the external contact locations. Under this embodiment, the mask layer might also be omitted, with the apertures of the sealing layer exposing a portion of the wafer passivation layer around the external contact locations. Similarly, while described in terms of sealing and forming conductive bumps on a semiconductor wafer, any type of electronic device substrate that requires external conductive elements would benefit from the application of the present invention. Furthermore, it is possible that methods other than STL might be used to form a sealing layer. In some instances, it may be more desirable to spin the sealing layer on and use a mask and etch technique to form the apertures or to simply dispense sealing material from a nozzle in an approximate pattern. The scope of the invention is, therefore, indicated by the appended claims, rather than the foregoing description. All changes which come within the meaning and range of equivalency of the claims are to be embraced within their scope.

What is claimed is:

1. An electronic device package comprising:
    a substrate including at least one electronic device with at least one external contact location on a surface thereof;
    a mask layer on the surface of the substrate having an opening therethrough exposing a central portion and surrounding a periphery of the at least one external contact location;
    a sealing layer on the mask layer having an aperture therethrough exposing the central portion of the at least one external contact location and a portion of the mask layer surrounding the periphery of the at least one external contact location;
    a discrete conductive element attached to the at least one external contact location, bounded by and in peripheral contact with the mask layer, spaced inwardly from a periphery of the aperture through the sealing layer, and extending from the surface of the substrate beyond an exposed surface of the sealing layer; and
    a lateral support layer on the exposed portion of the mask layer within the aperture at least partially surrounding a base portion of the discrete conductive element and laterally supporting the discrete conductive element.

2. The electronic device package of claim 1, wherein the substrate comprises a semiconductor substrate including at least one bond pad for electrical communication with the at least one electronic device.

3. The electronic device package of claim 2, wherein the at least one external contact location comprises the at least one bond pad.

4. The electronic device package of claim 2, further comprising at least one layer of metal over the at least one bond pad.

5. The electronic device package of claim 4, wherein the at least one external contact location comprises a portion of the at least one layer of metal located substantially directly over the at least one bond pad.

6. The electronic device package of claim 4, wherein the at least one external contact location comprises a portion of the at least one layer of metal located remote from the at least one bond pad.

7. The electronic device package of claim 2, wherein the semiconductor substrate comprises a semiconductor wafer bearing a plurality of electronic devices, each electronic device of the plurality of electronic devices having at least one external contact location exposed through the sealing layer.

8. The electronic device package of claim 7, further comprising another sealing layer over a back surface of the semiconductor wafer.

9. The electronic device package of claim 2, wherein the semiconductor substrate comprises an individual semiconductor die and the at least one external contact location is exposed through the sealing layer on an active surface of the semiconductor die.

10. The electronic device package of claim 9, further comprising at least another sealing layer on at least another surface of the semiconductor die.

11. The electronic device package of claim 1, wherein the lateral support layer extends laterally from the discrete conductive element to the sealing layer.

12. The electronic device package of claim 1, wherein the lateral support layer comprises a residual flux material from a solder paste used to form the discrete conductive element.

13. The electronic device package of claim 1, wherein the mask layer and the sealing layer comprise a substantially homogenous structure.

14. The electronic device package of claim 13, wherein the substantially homogenous structure comprises a plurality of superimposed layers of a cured photopolymer.

15. The electronic device package of claim 1, wherein the mask layer comprises one or more superimposed layers of a photocured material.

16. The electronic device package of claim 1, wherein at least the sealing layer comprises a polymer material.

17. The electronic device package of claim 1, wherein the discrete conductive element comprises a volume of at least one metal.

18. An electronic device package comprising:
    a substrate comprising a semiconductor die with at least one bond pad on an active surface thereof;
    a mask layer on the active surface surrounding and extending over a peripheral portion of metallization of an external contact location associated with the at least one bond pad with an opening through the mask layer exposing a central portion of the metallization of the external contact location;
    a sealing layer on the mask layer having an aperture therethrough exposing the central portion of the metallization of the external contact location and a portion of the mask layer surrounding the peripheral portion of the metallization of the external contact location;
    a discrete conductive element bonded to the central portion of the metallization, bounded by and in peripheral contact with the mask layer, spaced inwardly from a periphery of the aperture through the sealing layer and protruding beyond an exposed surface of the sealing layer; and
    a support layer on the mask layer within the aperture, surrounding a periphery of a base of the discrete conductive element and laterally supporting the base of the discrete conductive element.

19. The electronic device package of claim 18, wherein the discrete conductive element comprises a solder bump.

20. The electronic device package of claim 18, wherein the sealing layer and the mask layer comprise a substantially homogeneous structure including a plurality of layers.

21. The electronic device package of claim 18, wherein the support layer comprises an epoxy or resin flux material.

22. A wafer-scale electronic device package structure, comprising:
    a wafer-scale substrate comprising a plurality of semiconductor dice on an active surface thereof, each semiconductor die of the plurality including at least one bond pad on the active surface;
    a mask layer on the active surface with an opening therethrough exposing a central portion of metallization of an external contact location associated with the at least one bond pad of each semiconductor die, wherein the mask layer surrounds and extends over a peripheral portion of the metallization of the external contact location associated with the at least one bond pad of each semiconductor die;

a sealing layer on the mask layer having apertures therethrough, each aperture exposing a central portion of the metallization of each external contact location and the portion of the mask layer surrounding the peripheral portion of the metallization of the external contact location associated with the at least one bond pad of each semiconductor die;

a discrete conductive element bonded to an exposed central portion of the metallization of each external contact location, bounded by and in peripheral contact with the mask layer, spaced inwardly from a periphery of the aperture through the sealing layer, and protruding beyond an exposed surface of the sealing layer; and a support layer surrounding a periphery of a base of each discrete conductive element above the exposed portion of the mask layer within each of the apertures laterally supporting each discrete conductive element.

23. The structure of claim 22, wherein the discrete conductive elements comprise solder balls.

24. The structure of claim 22, wherein at least some of the external contact locations are remote from the associated at least one bond pad.

25. The structure of claim 22, wherein the support layer extends laterally from the periphery of the base of each discrete conductive element to a surface of the sealing layer within each aperture.

* * * * *